(12) United States Patent
Lee

(10) Patent No.: US 12,015,044 B2
(45) Date of Patent: Jun. 18, 2024

(54) IMAGE SENSOR MODULE AND CAMERA MODULE INCLUDING THE SAME

(71) Applicant: SAMSUNG ELECTRO-MECHANICS CO., LTD., Suwon-si (KR)

(72) Inventor: Kang Jin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 180 days.

(21) Appl. No.: 17/592,925

(22) Filed: Feb. 4, 2022

(65) Prior Publication Data

US 2023/0121510 A1 Apr. 20, 2023

(30) Foreign Application Priority Data

Oct. 14, 2021 (KR) .................. 10-2021-0136551

(51) Int. Cl.
| | |
|---|---|
| *H01L 27/146* | (2006.01) |
| *G02B 5/20* | (2006.01) |
| *H01L 23/00* | (2006.01) |
| *H04N 23/51* | (2023.01) |
| *H04N 23/55* | (2023.01) |

(52) U.S. Cl.
CPC ........ *H01L 27/14636* (2013.01); *G02B 5/208* (2013.01); *H01L 24/48* (2013.01); *H01L 27/14618* (2013.01); *H01L 27/14625* (2013.01); *H04N 23/51* (2023.01); *H04N 23/55* (2023.01); *H01L 2224/48227* (2013.01)

(58) Field of Classification Search
CPC ........ H04N 23/51; H04N 23/55; H04N 23/54; H04N 23/57; H01L 27/14636; H01L 24/48; H01L 27/14618; H01L 27/14625; H01L 2224/48227; H01L 2224/48091; H01L 2224/8592; G02B 5/208
See application file for complete search history.

(56) References Cited

U.S. PATENT DOCUMENTS

| | | | | |
|---|---|---|---|---|
| 2008/0191335 A1* | 8/2008 | Yang | ................ | H01L 21/6835 257/E23.18 |
| 2008/0246845 A1 | 10/2008 | Chan | | |
| 2010/0200898 A1* | 8/2010 | Lin | ................ | H01L 31/0203 257/E31.11 |
| 2011/0285890 A1* | 11/2011 | Choi | ................ | H04N 23/57 348/308 |
| 2012/0257075 A1* | 10/2012 | Kamada | ........... | H01L 27/14618 257/E31.127 |
| 2014/0035078 A1* | 2/2014 | Jan | ................ | H01L 27/14625 257/E31.119 |
| 2014/0035079 A1* | 2/2014 | Jan | ................ | H01L 27/14625 257/E31.127 |

(Continued)

FOREIGN PATENT DOCUMENTS

KR 10-2017-0089266 A 8/2017

*Primary Examiner* — Timothy J Henn
*Assistant Examiner* — John H Morehead, III
(74) *Attorney, Agent, or Firm* — NSIP Law

(57) ABSTRACT

An image sensor module includes an image sensor and a substrate on which the image sensor is disposed, wherein a step portion is provided on an upper surface of the substrate, an accommodation portion in which the image sensor is disposed is provided at the step portion, the image sensor is connected to the substrate by a bonding wire, and the bonding wire is covered with a bonding portion.

17 Claims, 5 Drawing Sheets

(56) References Cited

U.S. PATENT DOCUMENTS

| | | | |
|---|---|---|---|
| 2014/0035081 A1* | 2/2014 | Jan | H01L 27/14618 |
| | | | 257/E31.127 |
| 2015/0373239 A1* | 12/2015 | Choi | G02B 7/08 |
| | | | 348/374 |
| 2016/0197113 A1* | 7/2016 | Wong | H01L 27/14625 |
| | | | 257/432 |
| 2017/0322076 A1* | 11/2017 | Peng | G02B 5/226 |
| 2019/0075223 A1 | 3/2019 | Chen | |
| 2019/0174087 A1* | 6/2019 | Kim | H04N 25/79 |
| 2020/0098807 A1* | 3/2020 | Liu | H01L 27/14632 |
| 2021/0314468 A1* | 10/2021 | Liang | H04N 23/52 |
| 2022/0149099 A1* | 5/2022 | Kakoiyama | H01L 27/14618 |

* cited by examiner

IMAGE SENSOR MODULE AND CAMERA MODULE INCLUDING THE SAME

CROSS-REFERENCE TO RELATED APPLICATIONS

This application claims the benefit under 35 USC 119(a) of Korean Patent Application No. 10-2021-0136551 filed on Oct. 14, 2021, in the Korean Intellectual Property Office, the entire disclosure of which is incorporated herein by reference for all purposes.

BACKGROUND

1. Field

The present disclosure relates to an image sensor module and a camera module including the same.

2. Description of the Background

In general, camera modules may be applied to various Information Technology (IT) devices such as portable mobile communication devices, and due to the recent trend of miniaturization of portable mobile communication devices, camera modules may be required to be minimized.

The camera module may condense an image of a subject through an image sensor such as a charge coupled device (CCD) or a complementary metal-oxide-semiconductor (CMOS) and may store the condensed image as data in a memory of a device, and to this end, the image sensor may be mounted on a substrate and electrically connected to the substrate using a bonding wire.

Here, mounting of the image sensor on an upper surface of the substrate may increase an overall size of the camera module due to space occupied by the image sensor, and in addition, the overall size of the camera module may also increase by an installation space of the bonding wire for electrically connecting the image sensor and the substrate.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an image sensor module includes an image sensor, and a substrate on which the image sensor is disposed, wherein a step portion is provided on an upper surface of the substrate, an accommodation portion in which the image sensor is disposed is provided at the step portion, the image sensor is connected to the substrate by a bonding wire, and the bonding wire is covered with a bonding portion.

The accommodation portion may have a shape of a recess or a hole to accommodate the image sensor.

The bonding portion may cover a bonding pad provided at the image sensor and a bonding pad provided at the step portion.

The bonding pad provided at the step portion may be disposed in a position lower than that of the bonding pad provided at the image sensor in an optical axis direction.

An inclined surface may be disposed on the step portion, and the bonding pad provided at the step portion may be disposed on the inclined surface.

The image sensor may further include a sub-housing attached to the bonding portion, wherein an infrared (IR) cut-off filter may be disposed at the sub-housing.

An uneven portion may be provided on one surface of the sub-housing attached to the bonding portion.

A first blocking wall protruding toward the image sensor may be disposed in the sub-housing.

A second blocking wall protruding toward the step portion may be disposed in the sub-housing.

The bonding portion may be disposed between the first blocking wall and the second blocking wall.

A seating recess may be provided in one surface of the sub-housing facing the bonding portion.

The substrate may include a protrusion portion protruding toward the sub-housing from an outer side of the step portion, and the sub-housing may be bonded to the bonding portion and the protrusion portion.

The substrate may include a protrusion portion protruding toward the sub-housing from an outer side of the step portion, and an apex of the bonding wire may be positioned below an uppermost end surface of the protrusion portion.

A reinforcing plate may be coupled to a lower surface of the substrate.

A camera module may include a lens module including at least one lens, a housing accommodating the lens module, and the image sensor module configured to convert light incident through the lens module into an electrical signal.

In another general aspect, a camera module includes a lens module including at least one lens, a housing accommodating the lens module, a sub-housing coupled to the housing and allowing an IR cut-off filter to be disposed therein, and a substrate disposed below the sub-housing and allowing an image sensor to be mounted thereon, wherein the substrate includes an accommodation portion accommodating the image sensor, a step portion provided outside of the accommodation portion and positioned on the same plane on which an upper surface of the image sensor is positioned, and a protrusion portion provided outside of the step portion and protruding toward the sub-housing, wherein the image sensor is connected to the substrate by a bonding wire, the bonding wire is covered with a bonding portion, and the bonding portion is coupled to the sub-housing.

An apex of the bonding wire may be positioned below an uppermost end surface of the protrusion portion.

In another general aspect, an image sensor module includes a substrate including an accommodation portion and a step portion, an image sensor disposed in the accommodation portion, a bonding wire connected to the substrate in the step portion and connected to the image sensor, and a bonding portion disposed on the bonding wire.

An upper surface of the step portion may be disposed lower than an upper surface of the image sensor in an optical axis direction.

A camera module may include a lens module including at least one lens, a housing accommodating the lens module, the image sensor module configured to convert light incident through the lens module into an electrical signal, a sub-housing attached to the bonding portion, and an infrared (IR) cut-off filter disposed in the sub-housing to filter light incident through the lens module prior to the image sensor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
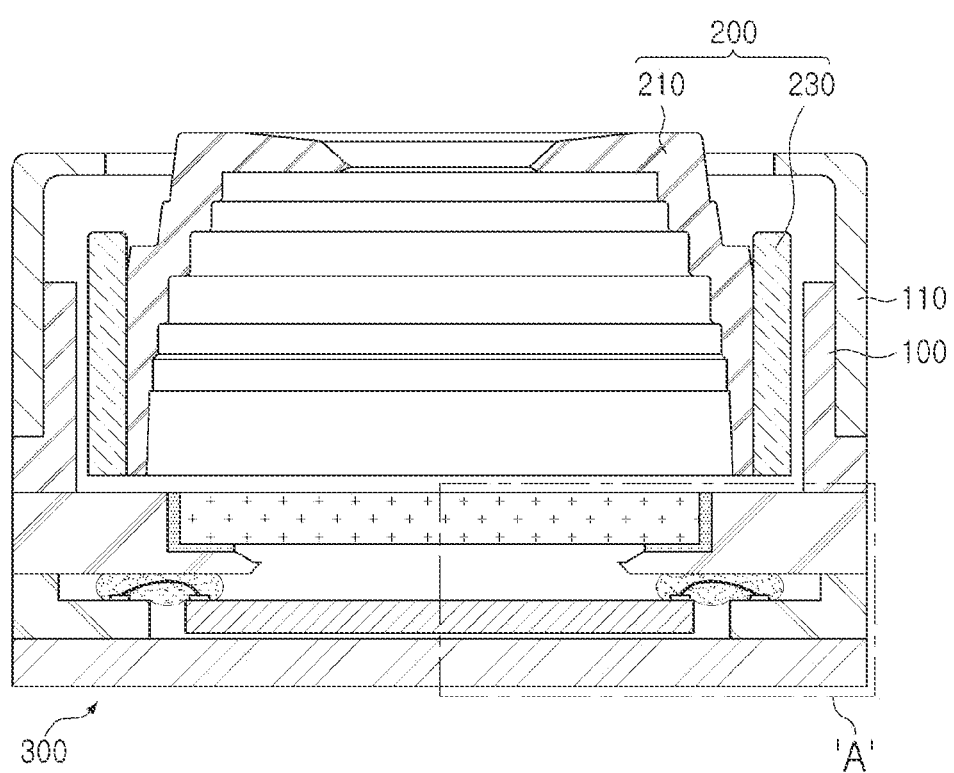
FIG. 1 is a schematic cross-sectional view of a camera module according to one or more example embodiments of the present disclosure.

Hereinafter, while example embodiments of the present disclosure will be described in detail with reference to the drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

Example embodiments provide an image sensor module which may reduce an installation space of a bonding wire for electrical connection between an image sensor and a substrate, and a camera module including the same.

Figure 2:
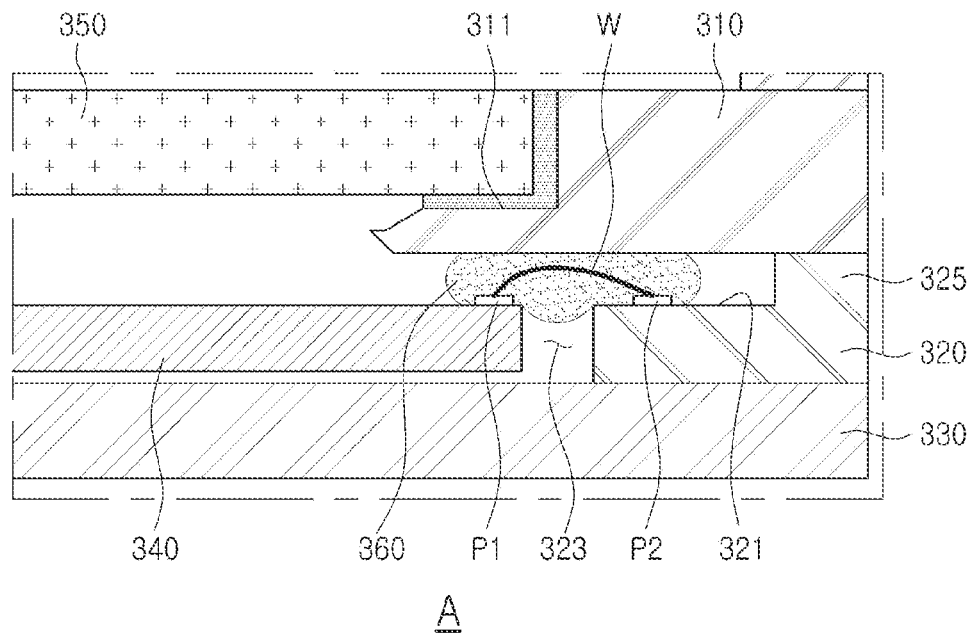
FIG. 2 is an enlarged view of a portion A of FIG. 1.
Figure 3:
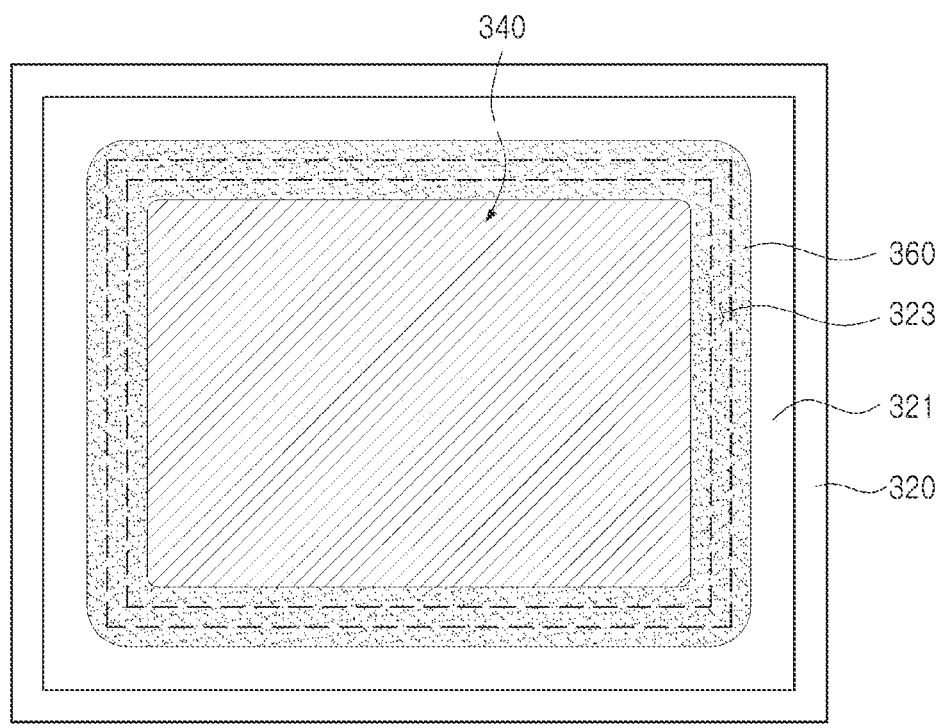
FIG. 3 is a plan view of an image sensor, a substrate, and a bonding portion according to one or more example embodiments of the present disclosure.

FIG. 1 is a schematic cross-sectional view of a camera module according to one or more example embodiments of the present disclosure, FIG. 2 is an enlarged view of a portion A of FIG. 1, and FIG. 3 is a plan view of an image sensor, a substrate, and a bonding portion according to one or more example embodiments of the present disclosure.

Referring to FIG. 1, a camera module according to an example embodiment of the present disclosure includes a lens module 200, a housing 100, a case 110, and an image sensor module 300.

The lens module 200 may include a lens barrel 210 and a lens holder 230.

At least one lens for imaging a subject may be accommodated in the lens barrel 210. When a plurality of lenses are disposed, the plurality of lenses are mounted inside the lens barrel 210 along an optical axis. The lens barrel 210 may have a hollow cylindrical shape.

The lens barrel 210 is coupled to the lens holder 230. The lens holder 230 may have a box shape with open top and bottom.

The lens barrel 210 and the lens holder 230 are accommodated in the housing 100. The lens module 200 may be disposed to be movable in the optical axis direction with respect to the housing 100 to adjust a focus.

To this end, although not illustrated in the drawings, the camera module may further include a driving unit providing driving force for focus adjustment. The driving unit may include a magnet disposed in the lens module 200 and a coil disposed to face the magnet in the housing 100.

However, the driving unit is not limited to a voice coil motor (VCM) including a magnet and a coil, and various methods such as a piezoelectric driving method using a piezoelectric element may be employed.

The housing 100 accommodates the lens module 200 therein. The housing 100 may be open in the optical axis direction. The image sensor module 300 is disposed below the housing 100.

The image sensor module 300 converts light incident through the lens module 200 into an electrical signal.

The image sensor module 300 includes an image sensor 340 and a substrate 320 on which the image sensor 340 is disposed.

The image sensor 340 converts light incident through the lens module 200 into an electrical signal. For example, the image sensor 340 may be a charge coupled device (CCD) or a complementary metal-oxide semiconductor (CMOS).

The electrical signal converted by the image sensor 340 is output as an image through a display unit of the portable electronic device in which the camera module is mounted.

The image sensor 340 is connected to the substrate 320 by a bonding wire W.

The image sensor module 300 may further include an infrared (IR) cut-off filter 350 and a sub-housing 310.

The IR cut-off filter 350 functions to block infrared rays in the light incident through the lens module 200.

Accordingly, infrared rays may be blocked when the light passing through the lens module 200 passes through the IR cut-off filter 350.

The IR cut-off filter 350 may be coupled to the sub-housing 310, and the sub-housing 310 may be coupled to the substrate 320.

The sub-housing 310 may include a mounting recess 311, and the IR cut-off filter 350 may be coupled to the mounting recess 311.

The substrate 320 may include an accommodation portion 323, a step portion 321, and a protrusion portion 325.

The accommodation portion 323 is a space in which the image sensor 340 is accommodated, and may be formed in a central portion of the substrate 320. The accommodation portion 323 may have a shape of a recess or a hole to accommodate the image sensor 340.

The step portion 321 is disposed outside of the accommodation portion 323. For example, the accommodation portion 323 may be configured by forming a recess or a hole in a partial area of the step portion 321.

A bonding pad P2 to which the bonding wire W is connected is disposed on the step portion 321. An upper surface of the step portion 321 may be on the same plane on which an upper surface of the image sensor 340 is placed.

The protrusion portion 325 is disposed on an outer side of the step portion 321 and may protrude toward the sub-housing 310 (or the housing 100).

The image sensor 340 is connected to the substrate 320 by the bonding wire W. For example, the image sensor 340 and the substrate 320 are provided with the bonding pads P1 and P2, respectively, and the image sensor 340 may be electrically connected to the substrate 320 by connecting one end and the other end of the bonding wire W to the bonding pads P1 and P2.

Accordingly, a space is required for the bonding wire W to be disposed between the upper surface of the image sensor 340 and the lower surface of the IR cut-off filter 350 (or the sub-housing 310).

That is, since a space for disposing the bonding wire W is required, it may be difficult to lower an overall height of the image sensor module 300 and the camera module due to this space.

In an example embodiment in the present disclosure, a distance between the upper surface of the image sensor 340 and the lower surface of the IR cut-off filter 350 (or the sub-housing 310) is reduced in the optical axis direction, thereby lowering the overall height of the image sensor module 300 and the camera module, and thus, the device may be miniaturized.

For example, the substrate 320 includes the step portion 321 formed in a position lower than that of an upper surface of the outermost portion of the substrate 320, a recess or hole is formed in a portion of the step portion 321 to form the accommodation portion 323, and the image sensor 340 is disposed in the accommodation portion 323. Accordingly, the distance in the optical axis direction between the upper surface of the image sensor 340 and the lower surface of the IR cut-off filter 350 may be reduced, and thus, the overall height of the image sensor module 300 and the camera module may be reduced.

The bonding wire W may be damaged when the bonding wire W and the IR cut-off filter 350 (or the sub-housing 310) come into contact with each other, and thus, a space in the optical axis direction is also required between the bonding wire W and the IR cut-off filter 350 (or the sub-housing 310). This space also makes it difficult to lower the overall height of the image sensor module 300 and the camera module.

The image sensor module 300 according to an example embodiment of the present disclosure includes a bonding portion 360 covering the bonding wire W.

In addition, the bonding portion 360 may be coupled to the sub-housing 310. Therefore, the existing space between the bonding wire W and the IR cut-off filter 350 (or the sub-housing 310) may be deleted, and accordingly, the overall height of the image sensor module 300 and the camera module may be further reduced.

A size of the accommodation portion 323 may be larger than a size of the image sensor 340. Accordingly, a certain space may be provided between a side surface of the image sensor 340 and an inner wall of the accommodation portion 323.

This space may serve to prevent the bonding portion 360 from violating an effective imaging area of the image sensor 340.

For example, since an adhesive constituting the bonding portion 360 may be stored in the space provided between the side surface of the image sensor 340 and the inner wall of the accommodation portion 323, the adhesive may be prevented from flowing to the effective imaging area of the image sensor 340.

The bonding portion 360 may cover a partial region of the image sensor 340 and a partial region of the step portion 321. For example, the bonding portion 360 may cover the bonding pad P1 provided on the image sensor 340 and the bonding pad P2 provided on the step portion 321.

Therefore, the bonding pads P1 and P2 and the bonding wire W may be protected by the bonding portion 360, and thus, a problem in which the bonding wire W is broken or damaged even when an external shock is applied may be prevented.

In addition, by the bonding portion 360, foreign substances that may occur from the bonding wire W or the bonding pads P1 and P2 may be prevented from penetrating into the image sensor 340.

The bonding portion 360 may have a color absorbing light. The bonding portion 360 may have a low reflectance color, and for example, the bonding portion 360 may be black.

Accordingly, light unnecessary for image formation may be prevented from being incident on the image sensor 340.

That is, when light reflected from other devices in the camera module is incident on the image sensor 340, a flare phenomenon may be induced, but in the case of image sensor module 300 according to an example embodiment of the present disclosure, light diffusely reflected in the camera module may be prevented from being incident on the image sensor 340 by the bonding portion 360 disposed around the sensor 340.

The sub-housing 310 may be bonded to the bonding portion 360, but is not limited thereto, and may also be bonded to the protrusion portion 325 of the substrate 320.

An apex of the bonding wire W may be located below the uppermost end surface of the protrusion portion 325.

Since the substrate 320 includes the step portion 321 and the accommodation portion 323, a portion having a thickness in the optical axis direction thinner than that of other portions is formed in the substrate 320. As a result, rigidity of the thinner portion in the substrate 320 is weakened.

Thus, the image sensor module 300 according to an example embodiment of the present disclosure may further include a reinforcing plate 330 for reinforcing the rigidity of the substrate 320.

The reinforcing plate 330 may be coupled to a lower surface of the substrate 320. A material of the reinforcing plate 330 is not particularly limited, but may be a non-magnetic metal material.

Figure 4:
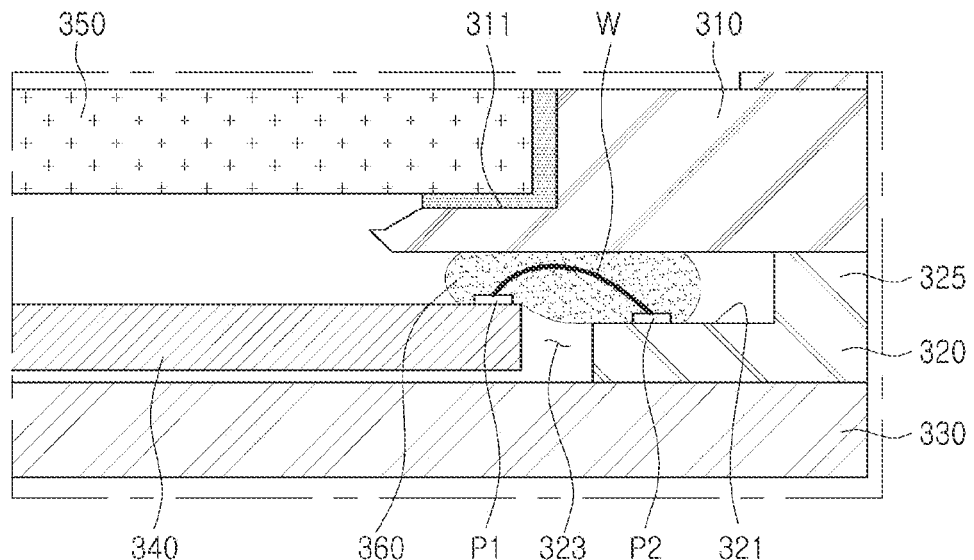
FIG. 4 is a first modified example of FIG. 2.
Figure 5:
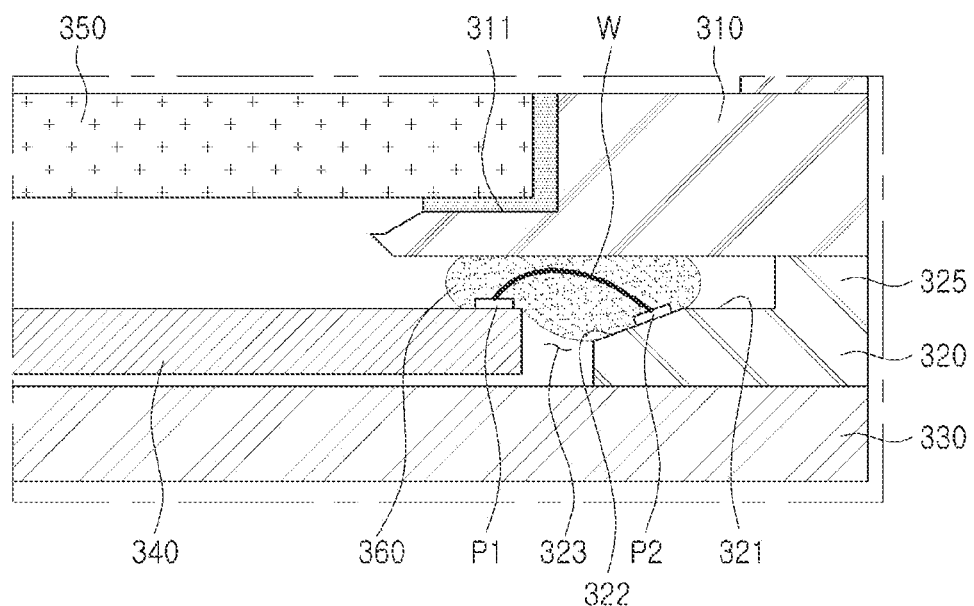
FIG. 5 is a second modified example of FIG. 2.

FIG. 4 is a first modified example of FIG. 2, and FIG. 5 is a second modified example of FIG. 2.

Referring to FIGS. 4 and 5, the bonding pad P2 provided in the step portion 321 may be disposed in a position in the optical axis direction lower than that of the bonding pad P1 provided in the image sensor 340.

For example, an upper surface of the step portion 321 may be disposed in a lower position in the optical axis direction than the upper surface of the image sensor 340 (refer to FIG. 4). Accordingly, the bonding pad P2 provided on the step portion 321 may also be disposed in a lower position in the optical axis direction than the bonding pad P1 provided on the image sensor 340.

An inclined surface 322 may be disposed on the step portion 321, and the bonding pad P2 may be disposed on the inclined surface 322 (see FIG. 5). Also, in this case, the bonding pad P2 provided on the step portion 321 may be disposed in a lower position than the bonding pad P1 provided on the image sensor 340.

Accordingly, since the space in the optical axis direction occupied by the bonding wire W may be further reduced, the overall height of the image sensor module 300 and the camera module may be further reduced.

Figure 6:
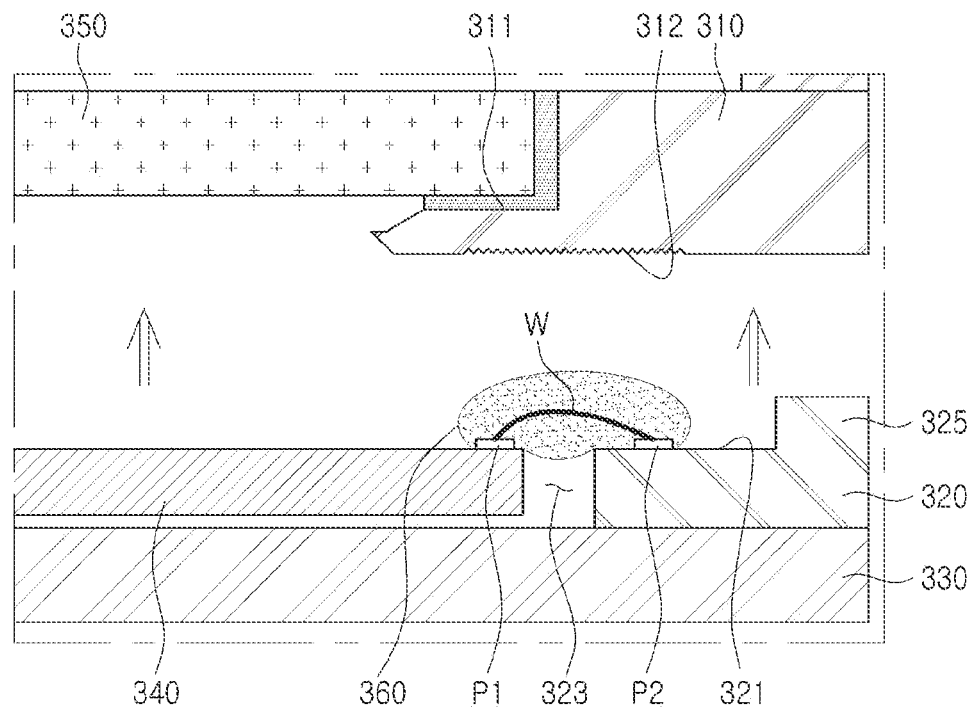
FIG. 6 is a third modified example of FIG. 2.

FIG. 6 is a third modified example of FIG. 2.

Referring to FIG. 6, an uneven portion 312 may be provided on one surface of the sub-housing 310 bonded to the bonding portion 360.

The uneven portion 312 may be formed by, for example, etching one surface of the sub-housing 310 to form a rough surface.

Since a bonding area between the bonding portion 360 and the sub-housing 310 may be increased by the configuration of the uneven portion 312, bonding force between the bonding portion 360 and the sub-housing 310 may be improved.

Figure 7:
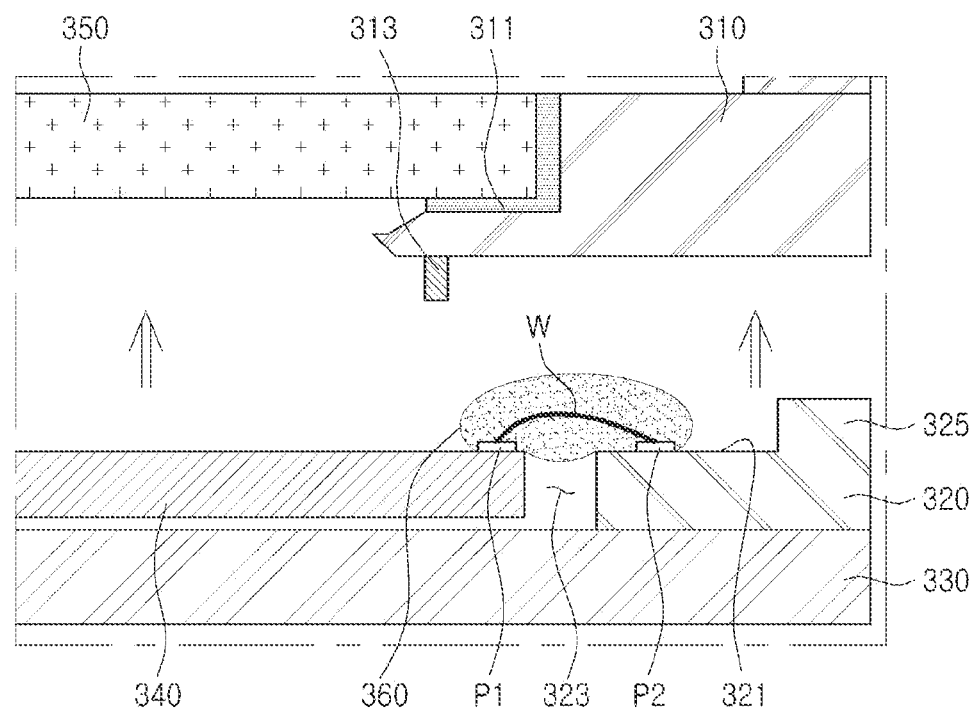
FIG. 7 is a fourth modified example of FIG. 2.
Figure 8:
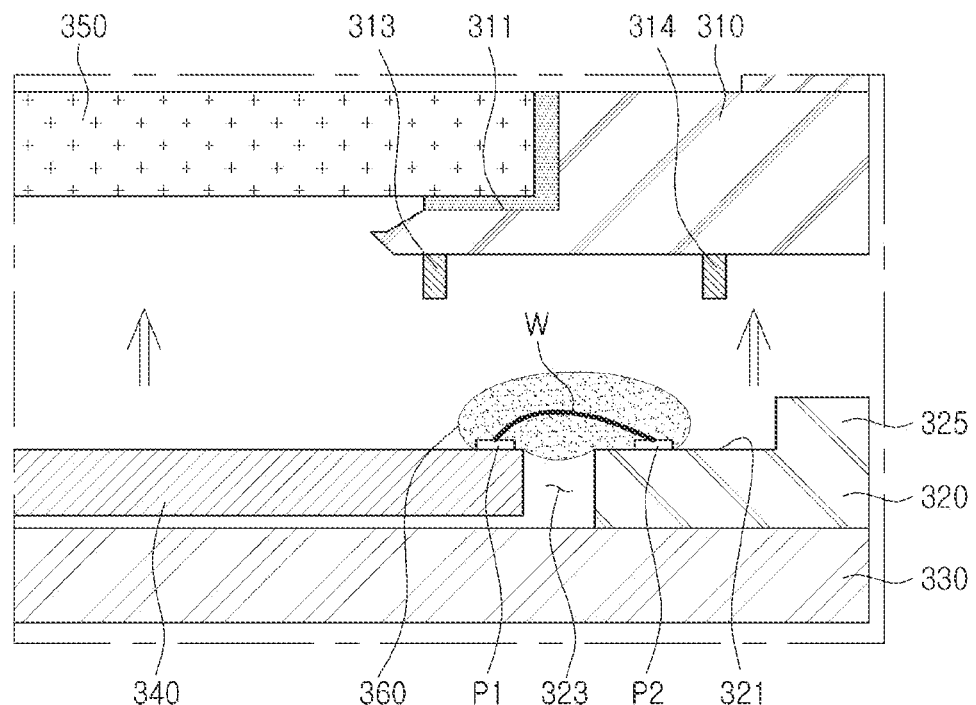
FIG. 8 is a fifth modified example of FIG. 2.

FIG. 7 is a fourth modified example of FIG. 2, and FIG. 8 is a fifth modified example of FIG. 2.

Referring to FIG. 7, a first blocking wall 313 protruding toward the image sensor 340 may be disposed on the sub-housing 310.

The first blocking wall 313 may serve to prevent the bonding portion 360 from violating the effective imaging area of the image sensor 340.

For example, the first blocking wall 313 may be disposed outside of the effective imaging area of the image sensor 340 to prevent the adhesive constituting the bonding portion 360 from flowing into the effective imaging area of the image sensor 340.

Also, referring to FIG. 8, the first blocking wall 313 protruding toward the image sensor 340 and a second blocking wall 314 protruding toward the step portion 321 may be disposed on the sub-housing 310, and the bonding portion 360 may be disposed between the first blocking wall 313 and the second blocking wall 314.

Since the bonding portion 360 is disposed in a space surrounded by the first blocking wall 313 and the second blocking wall 314, the adhesive constituting the bonding portion 360 may be prevented from flowing into the effective imaging area of the image sensor 340 and a bonding area of the bonding portion 360 may be increased to improve bonding force between the bonding portion 360 and the sub-housing 310.

Figure 9:
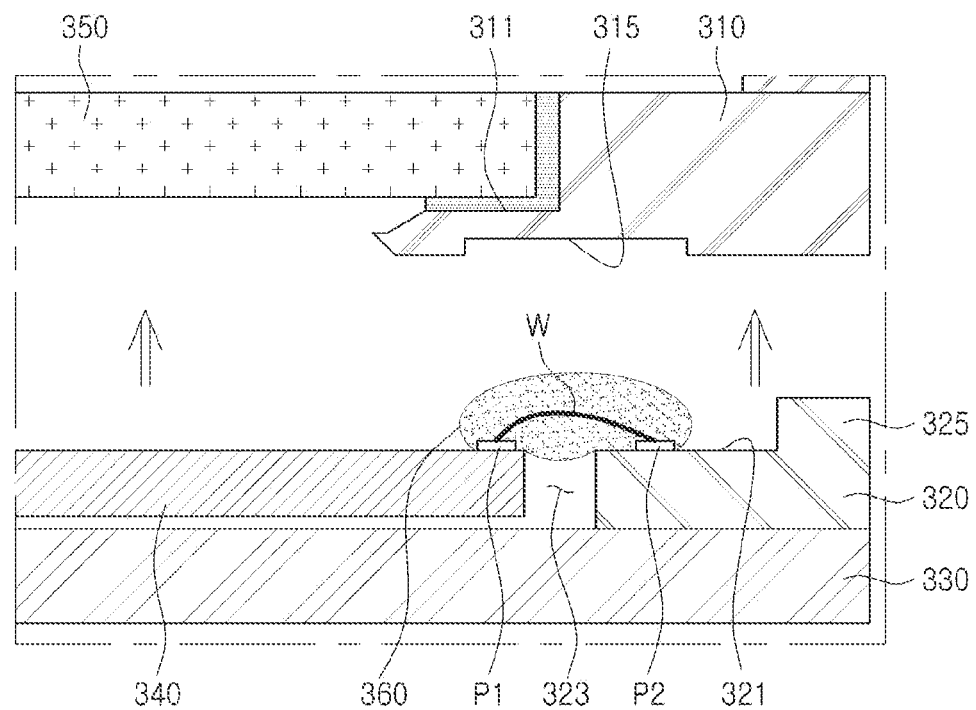
FIG. 9 is a sixth modified example of FIG. 2.

FIG. 9 is a sixth modified example of FIG. 2.

Referring to FIG. 9, a seating recess 315 may be provided on one surface of the sub-housing 310 facing the bonding portion 360.

The bonding portion 360 may be bonded to the seating recess 315. That is, since the bonding portion 360 is disposed in the seating recess 315, the adhesive constituting the bonding portion 360 may be prevented from flowing into the effective imaging area of the image sensor 340 and a bonding area of the bonding portion may be increased to improve bonding force between the bonding portion 360 and the sub-housing 310.

The components included in each example embodiment shown in FIGS. 1 to 9 may be applied to one or more other example embodiments, unless otherwise specified. For example, the uneven portion 312 of FIG. 6 may be combined with one or more of first blocking wall 313 of FIG. 7, first blocking wall 313 and second blocking wall 314 of FIG. 8, seating recess 315 of FIG. 9, difference in positions of bonding pads P1 and P2 of FIG. 4, and inclined surface 322 of FIG. 5. Likewise, for example, first blocking wall 313 of FIG. 7 may be combined with one or more of second blocking wall 314 of FIG. 8, seating recess 315 of FIG. 9, difference in positions of bonding pads P1 and P2 of FIG. 4, and inclined surface 322 of FIG. 5.

As set forth above, the image sensor module and the camera module including the same according to one or more example embodiments of the present disclosure may reduce a space for installing a bonding wire for electrical connection between an image sensor and a substrate.

While specific example embodiments have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor module comprising:
an image sensor; and
a substrate on which the image sensor is disposed,
wherein a step portion is provided on an upper surface of the substrate,
wherein an accommodation portion in which the image sensor is disposed is provided at the step portion,
wherein the image sensor is connected to the substrate by a bonding wire,
wherein the bonding wire is covered with a bonding portion,
wherein an inclined surface is disposed on the step portion, and a bonding pad provided at the step portion is disposed on the inclined surface, and
wherein an upper surface of the step portion is disposed lower than an upper surface of the image sensor in an optical axis direction.

2. The image sensor module of claim 1, wherein the accommodation portion has a shape of a recess or a hole to accommodate the image sensor.

3. The image sensor module of claim 1, wherein the bonding portion covers a bonding pad provided at the image sensor and the bonding pad provided at the step portion.

4. The image sensor module of claim 3, wherein the bonding pad provided at the step portion is disposed in a position lower than that of the bonding pad provided at the image sensor in an optical axis direction.

5. The image sensor module of claim 1, further comprising:
a sub-housing attached to the bonding portion,
wherein an infrared (IR) cut-off filter is disposed at the sub-housing.

6. The image sensor module of claim 5, wherein an uneven portion is provided on one surface of the sub-housing attached to the bonding portion.

7. The image sensor module of claim 5, wherein a first blocking wall protruding toward the image sensor is disposed in the sub-housing.

8. The image sensor module of claim 7, wherein a second blocking wall protruding toward the step portion is disposed in the sub-housing.

9. The image sensor module of claim 8, wherein the bonding portion is disposed between the first blocking wall and the second blocking wall.

10. The image sensor module of claim 5, wherein a seating recess is provided in one surface of the sub-housing facing the bonding portion.

11. The image sensor module of claim 5, wherein
the substrate includes a protrusion portion protruding toward the sub-housing from an outer side of the step portion, and
the sub-housing is bonded to the bonding portion and the protrusion portion.

12. The image sensor module of claim 5, wherein
the substrate includes a protrusion portion protruding toward the sub-housing from an outer side of the step portion, and
an apex of the bonding wire is positioned below an uppermost end surface of the protrusion portion.

13. The image sensor module of claim 1, wherein a reinforcing plate is coupled to a lower surface of the substrate.

14. A camera module comprising:
a lens module including at least one lens;
a housing accommodating the lens module; and
the image sensor module of claim 1 configured to convert light incident through the lens module into an electrical signal.

15. An image sensor module comprising:
an image sensor; and
a substrate on which the image sensor is disposed,
wherein a step portion is provided on an upper surface of the substrate,
wherein an accommodation portion in which the image sensor is disposed is provided at the step portion,
wherein the image sensor is connected to the substrate by a bonding wire,
wherein the bonding wire is covered with a bonding portion,
wherein the bonding portion covers a bonding pad provided at the image sensor and a bonding pad provided at the step portion,
wherein the bonding pad provided at the step portion is disposed in a position lower than that of the bonding pad provided at the image sensor in an optical axis direction,
wherein an inclined surface is disposed on the step portion, and the bonding pad provided at the step portion is disposed on the inclined surface, and
wherein an upper surface of the step portion is disposed lower than an upper surface of the image sensor in an optical axis direction.

16. An image sensor module comprising:
a substrate comprising an accommodation portion and a step portion;
an image sensor disposed in the accommodation portion;
a bonding wire connected to the substrate in the step portion and connected to the image sensor; and
a bonding portion disposed on the bonding wire,
wherein an upper surface of the step portion is disposed lower than an upper surface of the image sensor in an optical axis direction, and
wherein an inclined surface is disposed on the step portion, and a bonding pad provided at the step portion is disposed on the inclined surface.

17. A camera module comprising:
a lens module including at least one lens;
a housing accommodating the lens module;

the image sensor module of claim 16 configured to convert light incident through the lens module into an electrical signal;

a sub-housing attached to the bonding portion; and an infrared (IR) cut-off filter disposed in the sub-housing to filter light incident through the lens module prior to the image sensor.

* * * * *